United States Patent [19]
Niven

[11] Patent Number: 5,461,306
[45] Date of Patent: Oct. 24, 1995

[54] DC CURRENT DETECTION SYSTEM FOR A CURRENT TRANSFORMER

[75] Inventor: Rex Niven, Bures Sur Yvette, France

[73] Assignee: Schlumberger Industries, Inc., Norcross, Ga.

[21] Appl. No.: 174,104

[22] Filed: Dec. 28, 1993

[51] Int. Cl.⁶ .................................... G01R 19/00
[52] U.S. Cl. .................. 324/102; 324/110; 324/127
[58] Field of Search .............................. 324/102, 110, 324/127

[56] References Cited

U.S. PATENT DOCUMENTS

| | | | |
|---|---|---|---|
| 4,255,705 | 3/1981 | Milkovic | 324/110 |
| 4,500,837 | 2/1985 | Shuey | 324/102 |

Primary Examiner—Kenneth A. Wieder
Assistant Examiner—Mark Wardas
Attorney, Agent, or Firm—Sanford J. Asman

[57] ABSTRACT

A system for detecting the presence of an average dc current component in a load comprising a current transformer 10 for supplying a signal representative of the current, and a comparison means 12 and 13, for example a microprocessor and associated RAM, for comparing values of the current taken at time intervals corresponding to a phase interval of substantially $n\pi$, where $n\pi$ is an odd integer, of the ac periodic supply signal, so as to determine the presence of a dc current component caused by rectification of the supply. In one embodiment, the signal from a voltage detecting means 14–18 can be used to synchronise the sampling of the current at the correct phase.

9 Claims, 3 Drawing Sheets

DC CURRENT DETECTION SYSTEM FOR A CURRENT TRANSFORMER

The present invention relates to a system for the detection of a dc current component in a load supplied with an ac signal.

One of the current sensors most commonly used in the field of metering in view of its low cost and relative accuracy is the current transformer. It is most effective in terms of resistance to external fields, temperature reliability etc. when built with a high permeability magnetic circuit, i.e. in which the flux passes via the intermediate of a high permability magnetic core. This unfortunately makes the transformer sensitive to dc current components in the primary which introduce a large magnetic bias and cause the transformer to operate in a semi-saturated or saturated mode. This in turn affects the measurement of current and presents opportunities for meter fraud, for example, by placing a diode in series with a resistor in parallel to the load being metered. The diode half-wave rectifies the current and produces a dc current component in the form of a non-zero average value of the signal, which component can "slow" the meter.

In addition to its deliberate use for fraudulent purposes, use of a diode to half-wave rectify an ac supply is a convenient and simple way for a heating device to be reduced to half power. In Europe, in view of the problems caused by such rectification, assymetric or half-wave rectified current is only permitted in small low-load devices. In contrast, no such regulations exist in the U.S. and the problem of non-deliberate dc saturation is thus more acute. Obviously, in either case a need exists to provide accurate detection and, if required, compensation of such saturating dc currents.

The alternative to avoid problems of saturation is to use an air-gap current transformer. However, such transformers introduce phase shifts in the measured signals and are sensitive to external fields and temperature changes.

In order to detect and compensate for dc saturation of a current transformer several prior art solutions have been developed. One such method, known as differential zero-crossing, is shown in U.S. Pat. No. 4,255,704. This patent describes a system for automatically compensating for dc saturation by deriving a control signal dependent on the difference between the duration of the positive and negative half cycles of the measured current signal, which control signal is fed back to the current transformer to neutralise the effects of the dc signal and to prevent saturation of the transformer. Another method, known as differential peak detection, is described in U.S. Pat. No. 4,255,705. In this method, a control signal is fed back to the transformer dependent on the difference between the peak amplitude values of the measured current signal. A further dc compensation method shown in U.S. Pat. No. 4,847,554 derives a control signal dependent on the difference between the integrated half cycles of the measured current signal.

All these prior art systems suffer from the disadvantage that they are sensitive to phase shifts introduced by complex elements in the load being measured, which in some circumstances can lead to the system failing to detect the presence of dc current components. It is therefore the aim of the present invention to provide a dc current detection system which overcomes these problems and which is reliable under a large range of conditions, including the presence of complex loads.

According to the present invention there is provided a system for detecting the presence of an average dc current component in a load supplied with an ac periodic supply signal comprising a current transformer for measuring the current consumed by the load and for supplying a signal representative of the current, and comparison means for receiving signals from the current transformer and adapted to compare values of the current signals at intervals of time equivalent to a phase interval of substantially $n\pi$ of the ac periodic supply signal, where n is an odd integer, to determine the presence of a dc component in the current taken by the load caused by rectification of the supply.

Thus, the present invention provides a particularly simple and effective means for monitoring dc saturation due to assymetric current devices. If we consider the load as being composed of a number of smaller loads, one of which rectifies the current, the contribution of the symmetric loads to the overall current at the points separated by $n\pi$ will be equal and opposite in sign (regardless of any phase shifts introduced by the loads), whilst the contribution by the rectified device will be effectively zero for the value taken during the half-wave portion when the diode is non-conducting, but non-zero for the value taken in the other half-wave portion. Thus, comparison of values of the current taken at phase intervals of $n\pi$ enables detection of dc saturation due to rectified current devices and is more reliable than the prior art devices, in which phase shifts introduced by complex loads can result in failure to detect dc saturation.

Although theoretically the present invention is not sensitive to saturation caused by a continuous dc source, rather than one having an average dc component due to rectification, in practice such sources are rare as their operation implies forcing power back into the mains network for half of the mains cycle. Thus, the present invention is effective in almost all cases.

In one particularly simple embodiment the comparison means includes an accumulation means for summing the values of the curent signals taken at a phase interval of substantially $n\pi$ and a threshold means for comparing the summed value with a threshold value. If no asymmetric load is present, the average summed value of the current after an even number of values are accumulated will remain at zero as adjacent values of the current taken will be equal and of opposite sign. In contrast, the presence of an asymmetric component will cause the summed value to reach a non-zero value. This embodiment is particularly practical when the invention is implemented digitally, for example, where the accumulation and threshold means of the comparison means are realised in a microprocessor and where the comparison means also comprises an analogue to digital convertor for sampling and converting values of the current at at least a phase difference of substantially $n\pi$ in response to a signal from the microprocessor, the converted values from the analogue to digital converter being summed in the accumulation means of the microprocessor.

Preferably, the system further comprises voltage detection means for detecting the voltage of the ac periodic supply signal and for supplying an output signal to the comparison means, the comparison means comparing values of the sensed current at intervals of time corresponding to a phase interval of substantially $n\pi$ of the voltage signal. This ensures that any drift in the frequency of the ac supply is reflected in a change in the timing interval of the values of the current compared. Alternatively, where the frequency of the supply voltage is stable the voltage sensing means may be dispensed with and a timer used to fix sampling of the current at a predetermined interval corresponding to that of the known value of $n\pi$ of the ac supply.

Advantageously, in the embodiment comprising a voltage sensing means the comparison means is adapted to compare values of the current taken at times corresponding to the peak values of the voltage.

Where the ac supply signal is rectified in series with a resistive load, such as in a heating device, the greatest points of difference between the current in the asymmetric load will be the difference between the peak value of the current in one half cycle (which will correspond to the peak voltage) and the zero value of the current during the non-conducting half cycle of the load.

In one embodiment the voltage detector may comprise a threshold detector, for example a zero-crossing detector, adapted to supply a signal to the comparison means at the points at which a threshold is passed.

In the simplest embodiment, the comparison means may operate to compare values of the input current signal at time intervals corresponding to a phase difference of substantially $\pi$ in the ac supply signal. Alternatively, a phase difference of substantially $3\pi$, $5\pi$, $7\pi$ etc. may be used.

In addition to the detection of a dc current, the system may further comprise means for applying a correction current to the current transformer to prevent saturation of the transformer. For example, in a digital realisation of the system a microprocessor may generate a control current value based on the determined magnetic saturation given by the accumulated value, e.g. by a look-up table of values, which may be amplified and fed back to the current transformer.

The present invention may also be embodied as part of a meter monitoring the consumption of electricity to an installation.

The present invention extends equally to a method of dc detection corresponding to the system described above.

There will now be described, by way of example, an embodiment of the present invention in relation to the following figures, in which.

Figure 1:
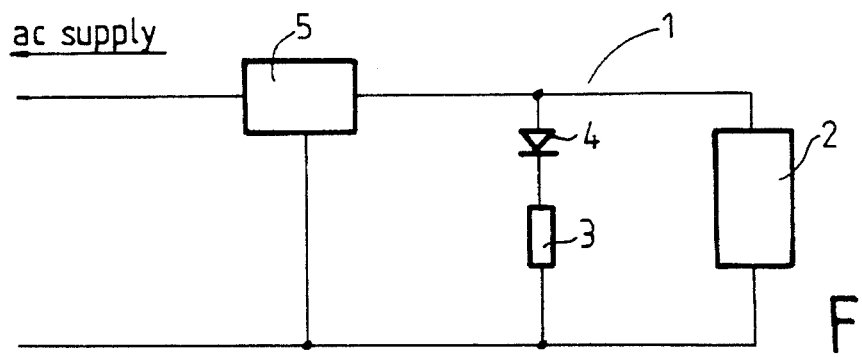
FIG. 1 shows in schematic an ac supply supplied to an installation including symmetric and asymmetric loads and having an associated meter.
Figure 2:
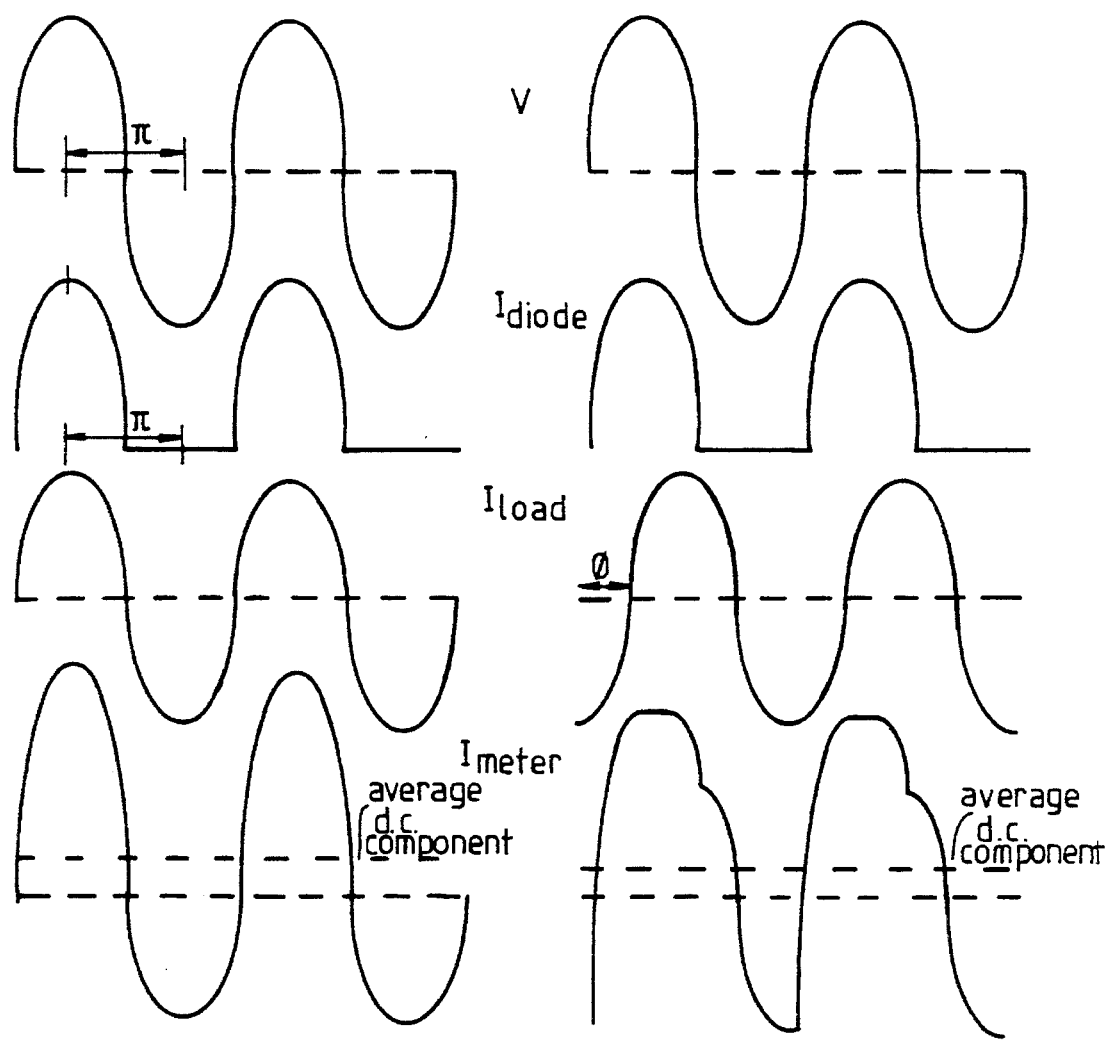
FIG. 2 shows the current and voltage waveforms present in the circuit of FIG. 1.

Referring to FIG. 1 there is shown an installation 1 for receiving an ac periodic supply signal and comprising a load 2, which may or may not be a complex load, and an asymmetric load in the form of a resistance 3 fed via a rectifying diode 4. The current and voltage fed to the installation are monitored by a meter 5. The currents passing through the individual elements of the circuit of FIG. 1 are shown in FIG. 2 in relation to the supply voltage V. The left hand side of FIG. 2 shows the currents taken where the load 2 is entirely resistive and the right hand side shows the situation where the load 2 is complex. The current taken by the installation 1 and monitored by the meter 5 includes an average dc component which is not passed by the current transformer of the meter, but which acts to saturate the transformer.

Figure 3:
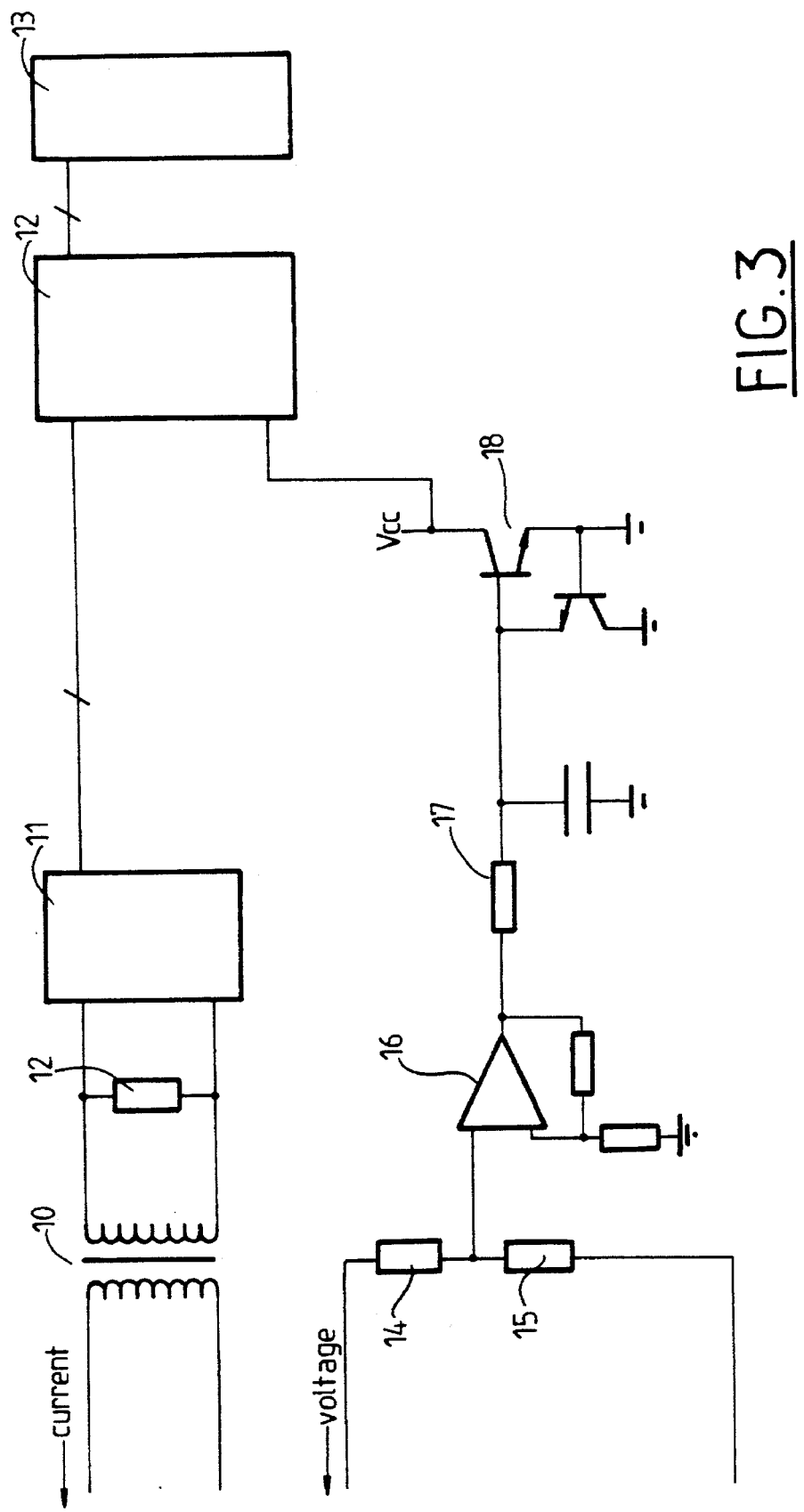
FIG. 3 shows an embodiment of the present invention for use in detecting dc current saturation in the current transformer of the meter of FIG. 1.

Referring to FIG. 3 there is shown a circuit arrangement for monitoring for the presence of a dc component introduced by rectification of the ac periodic supply and comprising a current transformer 10 supplying an analogue to digital converter 11 via a burden resistor 12, the operation of the converter to sample values of the current being controlled by a microprocessor 120 having an associated RAM memory store 13. The voltage taken by the installation is fed via a voltage divider 14, 15 to a Schmitt trigger 16, in the form of an op-amp and associated resistances. The signal from the Schmitt trigger is then passed via a high frequency filter 17, having a resistor and capacitor, to remove any jitter from the signal, and from the filter 17 to the microprocessor 120 via a level shifter 18 which transforms the voltage of the signal from the Schmitt trigger to a voltage acceptable to the microprocessor 12.

The dc detection system shown in FIG. 3 forms part of an overall metering system where, for example, the signal from the current transformer 10 converted by the analogue to digital converter 11 and the voltage signal from the voltage divider 14, 15 may be used for calculation of the power consumed by the installation. In such a meter the microprocessor may be used to multiply the signals from the converter 11 and from the voltage divider 14, 15 (either directly or via another analogue to digital converter).

A pulse signal from the Schmitt trigger will be output when the voltage signal passes a predetermined threshold, i.e. at a time delay after a positive zero-crossing. Further time delays may be introduced by the other elements of the circuitry. The total time delay can be determined empirically and compensated for by the microprocessor in calculating the time for sampling the current values.

In operation, the microprocessor times a selected number of zero-crossings as detected by the Schmitt trigger circuitry in order to determine the period of a selected number of cycles. From this measurement the microprocessor calculates the timing interval for samples taken by the analogue to digital converter by division of the time of the number of cycles by a numerical value to give a desired number of current samples per cycle of the ac supply. If the signal from the analogue to digital converter is to be used in the calculation of power consumption the microprocessor may control the converter to take, for example, eight samples of the current per cycle. Less current samples may be taken if the circuit is only to be used to detect the presence of dc saturation.

In calculating the presence of dc saturation, the signal from the Schmitt trigger is used to synchronise the sampling of the current by the converter such that the values of the current at the times corresponding substantially to the peak voltages of the ac supply are taken and accumulated in the peak RAM 13, that is at times separated by a value equivalent to a phase difference of $\pi$ in the supply voltage. Referring to FIG. 2, it will be readily appreciated that the values of the current passing through the symmetric load 2 are equal and opposite in sign at the peak values of the supply voltage, regardless of any phase shift introduced by a complex load. In contrast, the current through the diode 4 is at a maximum at one peak and zero at another. Thus, simply summing the values of the current sampled at these points will mean that the current values taken by any symettric load will cancel each other whilst the presence of an asymmetric load will cause the value stored in the accumulator to rise with time. This value is monitored by the microprocessor and its value after a predetermined even number of samples can be taken as a measure of the amount of the saturation. The exact number of samples chosen may be determined by experiment, but it must be equal to an even number to ensure cancellation of the component representing the symmetric load.

As discussed above, the timing delays introduced by the Schmitt trigger circuitry should be taken into account to ensure that the samples taken and stored in the RAM correspond to the peak values of the ac signal, as at this point the contribution by the asymmetric (but non-complex) load will be at its greatest. However, the system will also work with samples taken at points not corresponding to the peaks and/or at points separated in time by values corresponding to $3\pi$, $5\pi$ etc. of the phase of the ac supply signal.

If the microprocessor includes an analogue to digital converter connected separately to the voltage supply, for example, for metering purposes, the sign bit from this converter can be used as a zero-crossing indicator and/or to calibrate any time delays introduced by the Schmitt trigger circuity.

Figure 4:
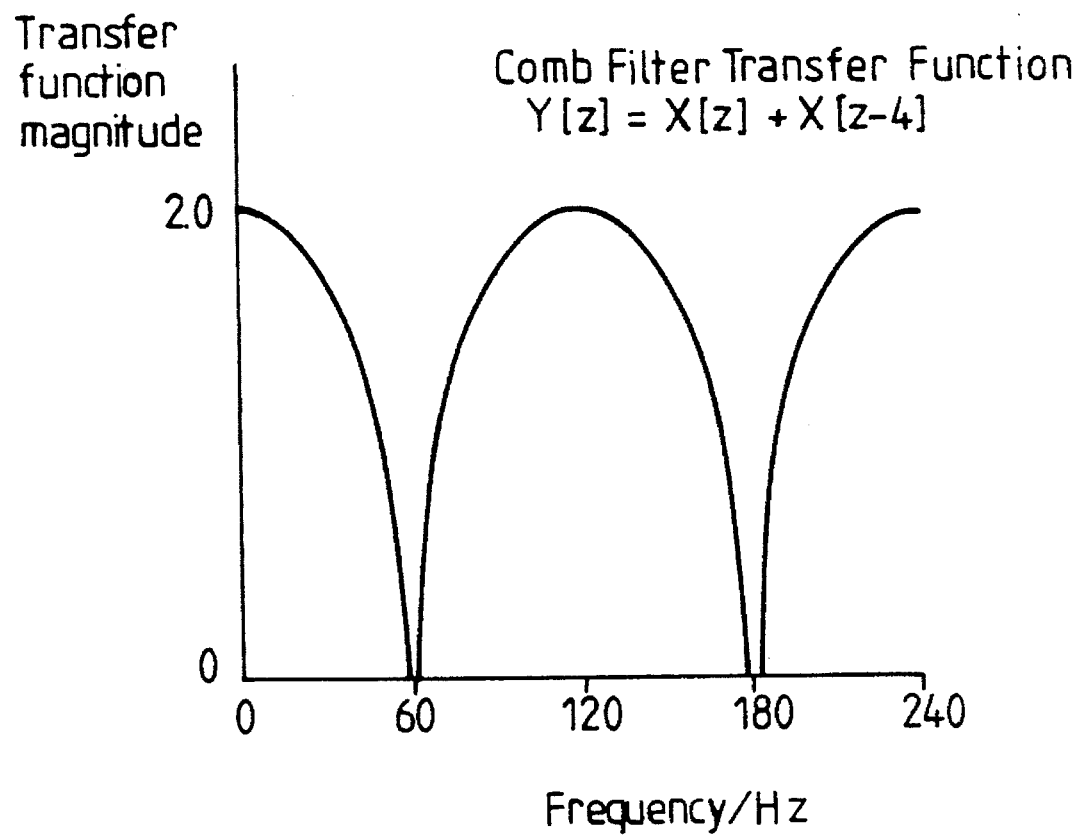
FIG. 4 shows the response of the circuit of FIG. 1 to the frequency of the current.

The effect of sampling the current at points corresponding to the peak values of the supply may equally be considered as applying a comb filter to eliminate the odd harmonics of the signal and FIG. 4 shows the frequency response of the circuit of FIG. 1. The transfer function is defined for the case where eight current samples are taken per cycle and where the microprocessor stores every fourth sample in the RAM.

The system may equally be applied to detect dc saturation in a multiphase supply measuring the dc saturation in each individual phase of the supply.

I claim:

1. A system for detecting the presence of an average dc current component in a load supplied with an ac periodic supply current, the system comprising:

(a) a current transformer for measuring current consumed by said load and for supplying a signal representative of said current consumed by said load;

(b) comparison means for receiving signals from the current transformer and adapted to compare values of the current signals at intervals of time equivalent to a phase interval of substantially $n\pi$ of the ac periodic supply signal, where n is an odd integer, to determine the presence of a dc component in the current taken by the load caused by rectification of the supply; and (c) voltage detection means for detecting the voltage of the voltage of the ac periodic supply signal and for supplying an output signal to said comparison means, said comparison means comparing values of the sensed current at intervals of time corresponding to a phase interval of substantially $n\pi$ of the voltage signal.

2. The system of claim 1 in which the comparison means includes an accumulation means for summing the values of the current signals taken at a phase interval of substantially $\pi$ and a threshold means for comparing the summed value with a threshold value.

3. The system of claim 2 in which the accumulation and threshold means of the comparison means are realized in a microprocessor and where the comparison means also comprises an analog to digital convertor for sampling and converting values of the current at a phase difference of substantially $n\pi$ in response to a signal from the microprocessor, the converted values from the analog to digital converter being summed in the accumulation means microprocessor.

4. The system of claim 1, in which the comparison means is adapted to compare values of the current taken at times corresponding to the peak values of the voltage and in response to the signal from the voltage sensing means.

5. The system of claim 1 in which the voltage detector comprises a threshold detector adapted to supply a signal to the comparison means when a threshold is passed.

6. The system of claim 1 in which the comparison means operates to compare values of the input current at time intervals corresponding to a phase difference of substantially $\pi$ of the ac supply signal.

7. A method of detecting the presence of an average dc current component in a load supplied with an ac periodic supply signal comprising the steps of:

(a) measuring the current consumed by the load;

(b) comparing the measured values of the consumed current taken at intervals of time corresponding to a phase interval of substantially $\pi$ of the ac periodic supply signal, where n is an odd integer, to determine the presence of a dc component in the current taken by the load caused by rectification of the supply; and (c) sensing the voltage supplied to the load and comparing the measured current values taken at a phase interval of substantially $n\pi$ of the voltage signal.

8. The method of claim 7, wherein the step of comparing the values of the measured current comprises summing the values of the current taken at intervals of substantially $n\pi$ of the ac periodic supply signal and comparing the summed values with a threshold value.

9. The method of claim 7 further comprising comparing values of the current taken at times corresponding to the peak values of voltage signal.

* * * * *